United States Patent [19]

Losehand et al.

[11] Patent Number: 4,859,616
[45] Date of Patent: Aug. 22, 1989

[54] METHOD OF MAKING SCHOTTKY CONTACTS ON SEMICONDUCTOR SURFACES

[75] Inventors: Reinhard Losehand, Munich; Helmut Eger, Olching, both of Fed. Rep. of Germany

[73] Assignee: Siemens Aktiengesellschaft, Berlin and Munich, Fed. Rep. of Germany

[21] Appl. No.: 163,482

[22] Filed: Mar. 3, 1988

Related U.S. Application Data

[60] Continuation of Ser. No. 60,706, Jun. 10, 1987, abandoned, which is a division of Ser. No. 749,913, Jun. 28, 1985, abandoned.

[30] Foreign Application Priority Data

Oct. 26, 1984 [DE] Fed. Rep. of Germany ....... 3439315

[51] Int. Cl.$^4$ .......................................... H01L 21/265
[52] U.S. Cl. ......................................... 437/39; 357/91; 437/175
[58] Field of Search ..................... 437/39, 175; 357/91

[56] References Cited

U.S. PATENT DOCUMENTS

| | | | |
|---|---|---|---|
| 4,119,446 | 10/1978 | Mastrioanni | 148/1.5 |
| 4,441,931 | 4/1984 | Levin | 357/15 |
| 4,481,041 | 11/1984 | Müller | 357/91 |
| 4,638,551 | 1/1987 | Einthoven | 357/4 |

OTHER PUBLICATIONS

Battista et al., IBM-TDB, 18 (1976) 3229.

*Primary Examiner*—Upendra Roy
*Attorney, Agent, or Firm*—John F. Moran

[57] ABSTRACT

In a Schottky contact on a semiconductor surface (3) comprising in the semiconductor edge region of the Schottky contact a doped guard ring (7) applied as self-aligning, and in which portions of the semiconductor edge region are shielded by at least one layer including a method for the production of such a Schottky contact, an improvement of the electrical properties of the Schottky contact and an improvement of the yield in the production of the Schottky contact is achieved by using the principles of the invention. Furthermore, high-temperature treatment of the Schottky contact is also made possible. At least one layer, shielding portions of the semiconductor edge region, is applied as a self-aligning protective layer (5; 21, 22; 32; 33, 34) for the guard ring (7).

24 Claims, 8 Drawing Sheets

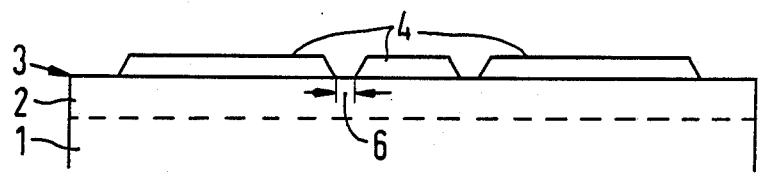
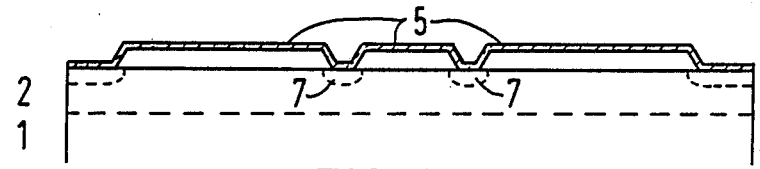
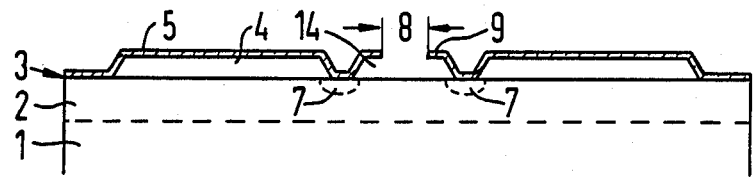
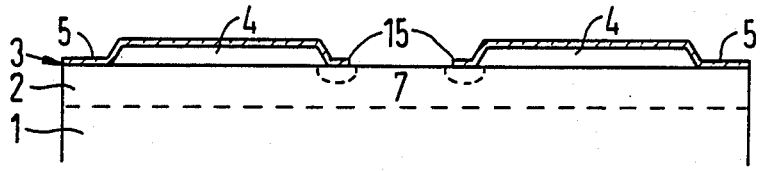
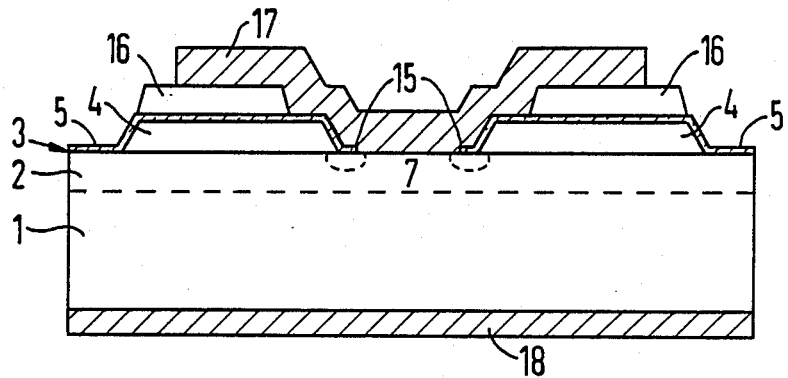

METHOD OF MAKING SCHOTTKY CONTACTS ON SEMICONDUCTOR SURFACES

This is a continuation division of application Ser. No. 060,706 filed June 10, 1987 abandoned, which is a divisional of Ser. No. 749,913, 06/28/85 abandoned.

BACKGROUND OF THE INVENTION

This invention relates to a Schottky contact on a semiconductor surface and also to a method for the production thereof.

In the following there is to be understood by guard ring width the difference between the radius of the outer guard ring and the radius of the inner guard ring.

In the manufacture of Schottky contacts for radio-frequency uses one tries in general to minimize parasitic capacitances of the guard ring. This can be achieved, inter alia, by a small guard ring width. This requirement can be attained by self-aligning-techniques in the formation of the in guard ring.

From German Patent Application No. 31 24 572 a method is known for the production of Schottky diodes with a guard ring applied as self-aligning. By this method guard ring widths can be obtained which are less than or equal to one micrometer. In this known method, high-temperature steps are carried out before the application of the Schottky contact. Because the known method is not suitable for the manufacture of Schottky contacts, the ultimately applied Schottky contacts must not be exposed to additional high-temperature processes that may be necessary after completed Schottky metallization.

The method described in the mentioned German document No. 31 24 572 is also disclosed in the U.S. patent application bearing the Ser. No. 383,266, filed Mar. 28, 1982, and now matured into U.S. Pat. No. 4,481,041 on Nov. 6, 1984 abandoned.

Often radio-frequency Schottky diodes are to be exposed to high-temperature processes after application of the Schottky metallization.

It may be desirable to install Schottky diodes in a housing, whereby such diodes are subjected to installation temperatures of up to 620° C. If, for example, two Schottky diodes are successively installed in such a housing one following the other, and if the two Schottky diodes are then exposed to different installation temperatures, the two Schottky diodes, if they have been manufactured according to prior art, will as a rule then have different parameters. If such housings, in which two Schottky diodes have been installed, are used for example in mixers, the two Schottky diodes installed in such a housing must have completely identical parameters also after their installation in this housing.

Also for achieving high reliability, High-Rel quality control, it becomes necessary to pre-age a Schottky contact at high temperatures of 500° C.

Tempering between 400° and 700° C. is not possible with the Schottky contacts produced in the conventional manner for the reason that at these temperatures alkali impurities migrate from the contact metal into the insulator layer of the diodes, whereby the breakdown voltage of such diodes is reduced.

One attempt to remedy this deficiency is by coating all edges of the insulator material of the Schottky diodes with silicon nitride, by so-called edge sealing. However, to open the silicon nitride seal in the guard ring region requires a further photo/graphic processing, and this in turn results in an increase of the guard ring width, because in such a conventional method, where adjusting is done twice, the guard ring width must be at least double the greatest adjusting or alignment registration allowance.

While such edge sealing prevents alkali impurities from penetrating into the insulator layer of Schottky diodes during the planned tempering operations, it produces excessive parasitic capacitances of the guard ring due to its required rather large width which—as previously mentioned—are not acceptable for radio-frequency diodes.

The process disclosed in the previous referred to German patent application No. 31 24 575, which until now is being used for the production of ultrahigh frequency diodes with self-aligning guard ring, has low yields. In the conventional manufacturing process the Schottky metallization is variable, a fact which, in the manufacture of very many Schottky contacts, lead to asymmetries in the construction of these Schottky contacts in a large part of them and hence to relatively unfavorable electrical properties and hence to a relatively poor yield in the statistical average.

In Schottky metallization which tends to form silicide, this effect is intensified. Since in a Schottky contact according to prior art the guard ring region is normally not shielded, the distance between the oxide edge and the actual outer edge of the guard ring implant may easily be bridged upon formation of silicide.

Since in a Schottky contact with self-adjusted guard ring according to prior art the guard ring region is practically not shielded, after-treatments such a sputter etching, chemical etching, thermal oxidation, etc. on such a Schottky contact are useable to a very limited extent, because also in these after-treatments the distance between the oxide edge and the actual outer edge of the guard ring implant can easily be bridged.

SUMMARY OF THE INVENTION

It is a present object of the invention to provide a Schottky contact and a method of manufacturing wherein an improvement of the electrical properties of a Schottky contact and an improvement of the yield in the production of a Schottky contact is achieved.

Another object is to provide a Schottky contact in accordance with the inventive principles which enables the high-temperature treatment of devices using such Schottky contacts without changing the operating characteristic of these devices.

The execution of a structure produced by an adjusting method at equal manufacturing cost is always worse by a factor of two than that of the same structure produced with a self-aligning method. At a very much higher cost than with self-aligning method, the production of a structure by an adjusting method is, of course, possible in the production of a single Schottky contact with the same quality, but in this case a correspondingly poorer yield in the statistical average must be accepted, which then, despite the higher cost in the adjusting production, is inferior by a factor of 10 than with self-aligning production of the same structure. Schottky diodes with self-aligning protective layers can be identified by the fact that in the statistical average a self-aligning protective layer presents far lesser spatial asymmetries than a protective layer produced as adjusting.

If the self-aligningly produced protective layer for the guard ring comprises a nitride layer, very fine structures can be obtained in the Schottky contact and in the guard ring.

In an alternative embodiment of the invention, a nitride layer can be applied so that it seals hermetically even after a high-temperature treatment of the insulative layer of the Schottky diode. Here the nitride layer seals the insulative layer of the Schottky diode internally and externally on silicon. Such a hermitecally sealing nitride layer prevents that during tempering impurities being able to penetrate into the insulator layer of the Schottky diode from the outside. If such a nitride layer seals hermetically also on the inside of the silicon, a Schottky contact with such hermetically sealing nitride layer can be tempered to 700° C. without letting alkali impurities or other impurities from the Schottky metallization penetrate into the isulative layer of the Schottky diode.

If a nitride layer would not seal tightly on the inside of the silicon (semiconductor surface), impurities from the Schottky metal would, during a high-temperature treatment, penetrate into the insulator layer.

The interface between the semiconductor and the insulative layer of the Schottky diode must be clean. For this purpose then pn junction of the Schottky diode is designed as a guard ring. The insulative layer of the Schottky diode must be protected from chemical impurities. If any chemical impurities are able to penetrate into the insulative layer of the Schottky diode, the interface between the semiconductor and the insulator layer of the Schottky diode becomes bad, as a result the electrical properties of the Schottky diode are adversly affected.

In structures produced as self-aligning techniques fewer edges, corners, holes and oxide gaps occur than in structures produced as self-aligning. As such corners, edges, holes and oxide gaps favor the diffusion of impurities, a Schottky contact with a protective layer for the guard ring produced as self-aligning is especially advantageous for the guard ring.

A protective layer for the guard ring can advantageously be produced by reactive ion etching.

If the doping of the guard ring occurs by implantation, advantageously a diffused oxide can be applied on the semiconductor surface, namely at the point where the guard ring is to be formed. Such a diffused oxide retains impurities during implantation. These impurities can later be removed together with the diffused oxide. The diffused oxide helps avoid impurities (contaminations). Such a diffused oxide can be used also for preventing partial etching of the semiconductor of the Schottky diode during an etching operation necessary in the course of the manufacture process.

A nitride layer may advantageously be a high-temperature nitride layer of a thickness of 0.1 micron. A nitride layer may also be a plasma nitride layer of a thickness of 0.5 μm to 2 μm. A plasma nitride layer has the advantage that it can be applied at a lower temperature than a high-temperature nitride layer. Upon application of a high-temperature nitride layer on a silicon dioxide layer, hydrogen for example, which had previously been introduced into the silicon dioxide layer at 400° C. laboriously, does not remain in the silicon dioxide layer. When applying a plasma nitride layer on the silicon dioxide layer, this hydrogen remains in the silicon dioxide layer and can no longer escape from the silicon dioxide layer after application of the plasma nitride layer. Applying the Schottky metal in a self-adjusting depression has the advantage that the series resistance between the Schottky contact and the back of the semiconductor is reduced.

The invention can be used to advantage in Schottky diodes with self-adjusting guard ring as well as in the production of silicide diodes and also when using a moat etching structure. Both in the manufacture of silicide diodes and when using a moat etching structure, the invention helps avoid shortcircuits.

When using a nitride-oxide double layer, a defined width of the guard ring is possible also in case of silicide formation and with a moat etching treatment. The use of a nitride-oxide double layer as etching mask is especially advantageous in the case of an epitaxial film thickness of about 0.1 μm as it occurs in radio frequency Schottky diodes.

Use of a nitride layer makes possible a guard ring width of 0.1 μm. In microwave diodes a nitride layer does not interfere. At greater guard ring widths a nitride layer may be dispensed with. In highly blocking diodes a nitride layer is disturbing.

Advantageously a nitride layer can be used as mask in selective wet etching. For masking in plasma etching, it is advantageous to use an oxide layer.

Since with the use of a photolithographic processing the structure to be produced is produced with the usual photo technique methods to a precision of only about 10%, a structure can be produced much more exactly according to the invention principles than according to prior art.

What is essential to the invention is that the outer edge of the guard ring is securely shielded by a self-aligning protective layer applied on the guard ring. Thereby already a high yield is obtained in the manufacture of the Schottky contact. Hence the electrical and other parameters stipulated for a Schottky diode can be adhered to more exactly also in case of high-temperature treatment after the Schottky contact was applied. Thus also structure parameters for example at the guide ring or at the Schottky contact can be adhered to more exactly. In a Schottky contact made according to the invention, moreover, there is less danger of guard ring weaknesses due to rough masking metallization. Owing to this, effective guard ring widths smaller than 0.2 μm are easier to realize. Use of a diffused oxide permits a higher implantation energy even when the substance to be implanted is contaminated. Thereby the structure of the guard ring can be produced more exactly even if the implantation substance is contaminated.

The foregoing and other objects and features of this invention will be more fully understood from the following detailed description taken in conjunction with the accompanying drawing.

BRIEF DESCRIPTION OF THE DRAWING

FIGS. 6 to 10 illustrates the results of processing steps for the production of a Schottky contact according to a first illustrative embodiment of the invention.

DETAILED DESCRIPTION

Figure 1:
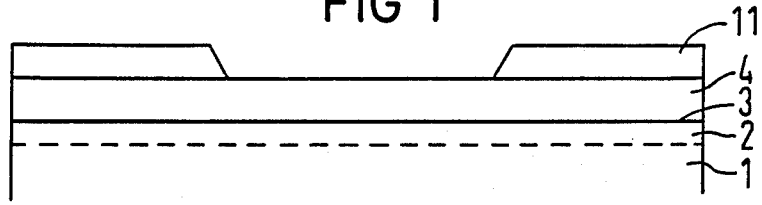
FIGS. 1 to 5 depict the results of a sequence of processing steps for the production of a conventional Schottky contact according to prior art.

Throughout the following figures, similar components will bear like reference numerals.

FIG. 1 shows a substrate 1, which may consist e.g. of silicon and may be p+-doped or n+-doped, for example. However, the substrate 1 may also be of another material, e.g. gallium arsenide (GaAs), indium phosphite (InP) or germanium (Ge). Also other than the stated substance dopants are possible. On the substrate 1 a semiconductor layer 2 is applied, deposited e.g. epitaxially which for n+-doped substrate is n-doped and for p+-doped substrate is p-doped and which preferably consists of silicon. Alternatively, however, the semiconducor layer 2 may consist of a different semiconductor material, e.g. gallium arsenide, indium phosphite or germanium. Also, depending on the substrate 1 used and depending on the area of use, the semiconductor layer 2 may have a different doping. On the surface 3 of the semiconductor layer 2 a first layer 4 will, after its structuring, form the insulator layer of the Schottky diode. The material of the first layer 4 must be selectively etchable relative to an electrically insulating material which will be applied later as second layer 5. In prior art, the first layer 4 is structured with the aid of a photo resist 11 by means of photo technique is such a way that the first layer 4 is completely removed in the guard ring region 6.

Figure 2:
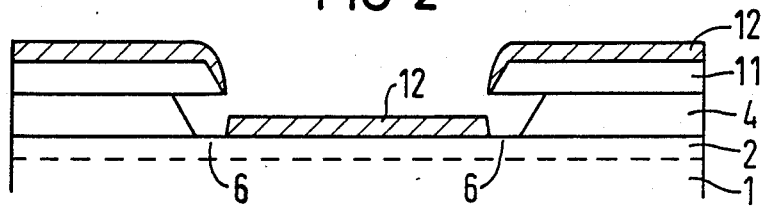

FIG. 2 shows a semiconductor chip according to FIG. 1 in which parts of the first layer 4 have been etched away in the guard ring region 6 and which thereafter has been coated with a metal 12. If the first layer 4 consists of silicon dioxide, a 10% hydrofluoric acid (HF) can be used for the etching away of silicon dioxide. In this etching operation, underetching under the edge of the photo resist 11 is permitted. The duration of the underetching defines the later guard ring width.

Figure 3:
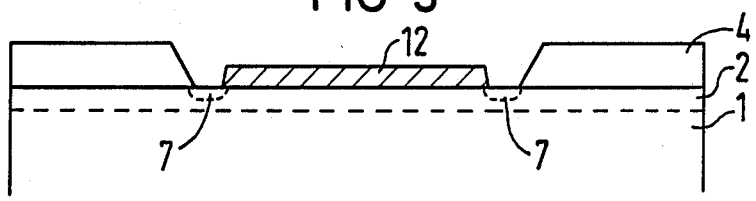

FIG. 3 shows a semiconductor chip according to FIG. 2 in which the photo resist 11 has been removed and in which the guard ring region 6 has been doped for example by implantation or by diffusion, so that in the guard ring region 6 of the guard ring 7 has formed.

Figure 4:
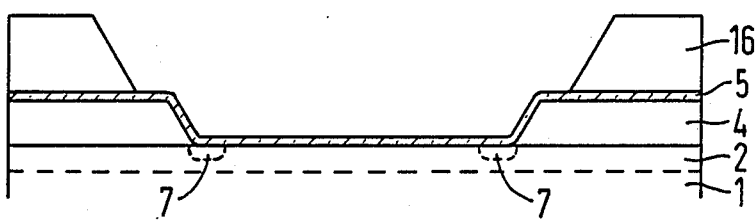

FIG. 4 shows a semiconductor chip according to FIG. 3 in which the metal 12 has been detached, which has then been coated with a second layer 5, in which then an additional oxide layer 16 has been applied, and in which lastly the additional oxide layer 16 has been stuctured by photo technique. The second layer 5 may be for example a silicon nitride layer, and the additional layer 16 may be for example a silicon dioxide layer.

Figure 5:
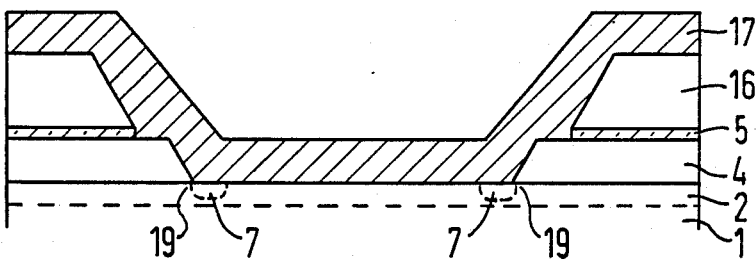

FIG. 5 shows a semiconductor chip according to FIG. 4, in which parts of the second layer 5 have been etched away, and on which finally a Schottky metal 17 has been applied. If the second layer 5 consists of silicon nitride, parts of this second layer 5 may be removed by wet etching with phosphoric acid ($H_3PO_4$).

A semiconductor chip according to FIG. 5 has critical regions 19, as the distance between the edge of the first layer 4 and the actual outer edge of the guard ring 7 can perhaps easily be bridged in a Schottky contact according to prior art. This readily leads to shrotcircuits and hence to a low yield in a Schottky contact made according to prior art. When producing Schottky silicide diodes, the silicon component both at the guard ring 7 and in the interior of the guard ring 7 is reduced. This increases the danger of shortcircuits. Also with the use of moat etching, parts both of the guard ring 7 and of the silicon located inside the guard ring 7 are removed. This, too, increases the danger of shortcircuits. Even should the guard ring 7 be shielded by a protective layer which had not been applied as self-aligning and therefore has imprecise structures, the danger of short-circuits is great in the production of Schottky silicide diodes or when using a moat etching technique, and generally without special additional techniques being used the yield is low.

FIGS. 6 to 10 explain a method for a Schottky contact according to a first embodiment of the invention. On the surface of the semiconductor layer 2, a first layer 4 of electrically insulating material is applied. The first layer 4 is structured e.g. by means of photo technique or by reactive ion etching in such a way that this first layer is removed in the guard ring region 6 entirely or, for producing a diffused oxide for later doping of the guard ring region 6, except for a slight layer thickness of approximately 0.1 $\mu$m or less. When using silicon for the semiconductor layer 2 and when using silicon dioxide for the first layer 4, a thin layer of silicon dioxide in the region of the guard ring surface can be produced by first completely removing the silicon dioxide layer in this region and subsequently again applying a thin layer by means of oxidation. Thereafter a doping of the guard ring region 6, for example, by implantation or by diffusion can take place. Thereafter, any possible existing slight layer thickness of the first layer 4 in the guard ring region 6 is completely removed.

FIG. 7 shows a semiconductor chip according to FIG. 6, on which a second layer 5 is deposited above the first layer on the entire area. The second layer 5 consists of electrically insulating material selectively etchable relative to the first layer 4, and which also acts as barrier against alkali includes. The second layer 5 may be so thin, for example about 0.1 $\mu$m, that doping of the guard ring region 6 through this second layer 5 is possible, unless the doping of the guard ring region 6 has taken place already before application of the second layer 5. The first layer 4 may be silicon dioxide ($SiO_2$) and the second layer 5 silicon nitride ($Si_3N_4$).

FIG. 8 shows a semiconductor chip according to FIG. 7, with a window 8 in the second layer 5 in the region above the Schottky contact to be applied. The opening of window 8 is smaller than the area of the planned Schottky contact. Window 8 may be produced for example by photo technique or by plasma etching. Through window 8 the underlying part 14 of the first layer 4 is selectively etched away completely. The etching time must be such that even in case of a maladjustment of window 8 the lateral underetching below the brims 9 is sufficient to completely etch away the underlying portion 14. As a rule this is easily possible, as the selectivity of the etching is good. Thereafter the brims 9 are etched away. Because when etching with phosphoric acid and using silicon nitride as second layer 5 the phosphoric acid both fills the opening of the removed part 14 and sweeps the brims 9 from the outside, that is, because the phosphoric acid attacks the brims 9 on both sides, the brims 9 are removed completely while the layer thickness of the rest of the second layer 5 is merely reduced to half. If the layers are given a suitable thickness, a sufficiently thick layer 5 is left on the remaining parts of the first layer. When using as the first layer 4 a silicon dioxide layer and as the second layer 5 a silicon nitride layer, it is advisable to make the silicon dioxide layer 0.1 m to 2 $\mu$m, more particularly, 1 $\mu$m, and the silicon nitride layer 0.05 $\mu$m to 1 $\mu$m, more particularly 0.1 $\mu$m thick.

If on the second layer 5 and hence on the brims 9 a photo resist or a silicon dioxide auxiliary layer is disposed before the brims 9 are etched away, the brims 9 will be attacked by the acid only from where previously part 14 of the first layer 4 had been arranged. With such a procedure the brims 9 can be removed completely without the rest of the second layer 5 being attacked by the acid. With such a procedure, therefore, the rest of the second layer 5 can retain its original thickness. After the etching away of the brims 9 it then suffices to remove the auxiliary layer (photo resist or silicon dioxide) present on the second layer 5.

FIG. 9 shows a semiconductor chip according to FIG. 8 after removal of the brims 9. The inner edge 15 of the second layer 5 is produced self-aligning with respect to the position of the guard ring 7 by the brim etching.

FIG. 10 shows a semiconductor chip according to FIG. 9 which above the second layer 5 is provided with an additional insulator layer 16, a Schottky contact 17 and a substrate contact 18. Applying the insulator layer 16 is not critical, but may be provided in order to reduce parasitic capacitances for example. The insulator layer 16 is important in diodes with a relatively small diameter of e.g. 10 $\mu$m. The insulator layer 16 may consist for example of silicon dioxide, plastic (polyimide), or glass. Due to the insulator layer 16, the diameter of the Schottky contact can be greater than the diameter of the diode. In diodes having a diameter of for instance 80 $\mu$m, an insulator layer 16 is not necessary.

As Schottky contact there is applied directly on the semiconductor surface 3 at least one Schottky metal, which shields the semiconductor surface 3 up to the inner edge 15 of the second layer 5 which may cover partially also the insulator layers. This Schottky contact 17 may consist of at least one of the materials titanium, molybdenum, platinum, palladium or nickel. For reinforcement, additional metal layers may be applied thereabove and over parts of the insulator layers, e.g. a layer sequence of platinum and gold. On the back of the semiconductor chip 18 in the substrate contact 18. Alternatively the substrate contact 18 may be provided on the front, e.g. in Beam-Lead tchnique orin a Flip-Chip realization of the Schottky diode.

Figure 11:
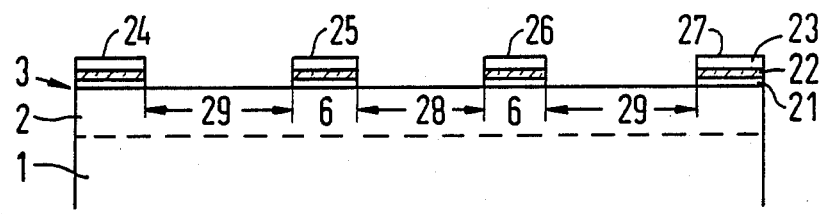
FIGS. 11 to 19 show the results of a sequence of processing steps for the production of a Schottky contact according to a second illustrative embodiment of the invention.

FIGS. 11 to 18 show a method for the manufacture of a Schottky contact according to a second embodiment of the invention. FIG. 11 shows a semiconductor chip like FIG. 6, but without a first layer 4. Over the entire sea of the semi-conductor surface 3 there are deposited one on the other first a silicon dioxide layer 21 about 0.1 $\mu$m thick, for example, then a silicon nitride layer 22 of a thickness of about 0.1 m for example, and again a silicon dioxide layer 23 of a thickness of about 0.2 m for example. By a photo technique or by reactive ion etching and subsequent selective etching of the individual layers 21, 22, 23, the guard ring region 6 is shielded by the residual mask portions 24 and 27. In addition, with the mask portions 24 and 27 the frame portions of a Schottky contact to be formed are shielded. The partial regions 28 and 29 of the semiconductor surface 3 are, on the contrary, exposed.

Figure 12:
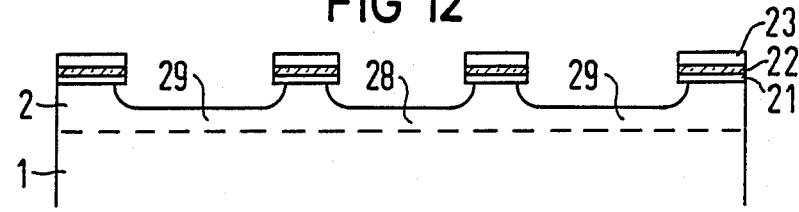

FIG. 12 shows a semiconductor chip according to FIG. 11, where parts of the semiconductor layer 2 within the partial regions 28 and 29 are etched away by plasma etching, reactive ion etching, or with the aid of an ion beam. For silicon plasma etching the silicon dioxide layer 23 is necessary for etch masking, as the silicon nitride layer 22 cannot serve as etch masking in siicon plasma etching.

Figure 13:
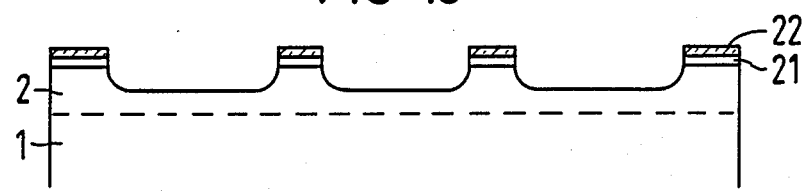

FIG. 13 shows a semiconductor chip according to FIG. 12, where the residual parts of the silicon dioxide layer 23 are removed e.g. by means of hydrofluoric acid. The brims of the mask portions 24, 25, 26, 27, which are present in a semiconductor chip according to FIG. 12, can be removed for example by first etching with hydrofluoric acid until the brims of the silicon dioxide layer 21 are removed, then etching with phosphoric acid until the brims of the silicon nitride layer 22 are completely removed, and finally wet etching by whole-area silicon dioxide overetching until the entire silicon dioxide layer 23 is removed.

The residual parts of the nitride layer 22 serve for the masking of the frame portions of the Schottky contact to be formed and for the masking of the guide ring region 6 in the subsequent oxidation process.

Figure 14:
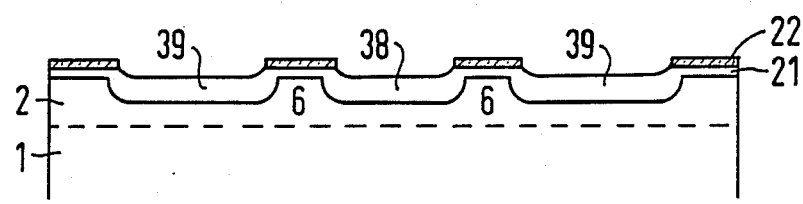

FIG. 14 shows a semiconductor chip according to FIG. 13, where thick oxide layers 38 and 39 have been produced in the partial regions 28 and 29. Such a thick oxide formation can be brought about for example by thermal oxidation in moist oxygen atmosphere. Alternatively, such selective oxidation can be carried out by means of high pressure or in a plasma.

Figure 15:
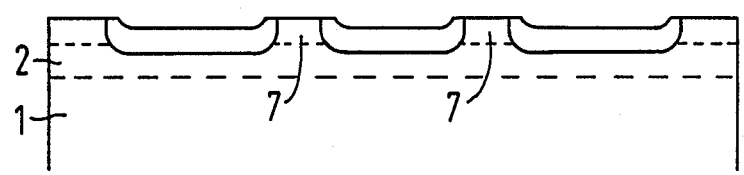

FIG. 15 shows a semiconductor chip 14, where the residual parts of the silicon nitride layer 22 are etched away e.g. with phosphoric acid. The guard ring region 6 can be doped across the silicon dioxide layer remaining in the guard ring region 6. Lastly the entire silicon dioxide layer of the semiconductor chip according to FIG. 14 is solidly overetched with hydrofluoric acid. This overetching continues until parts of the guard ring 7 and frame portions of the Schottky contact to be formed are exposed.

Figure 16:
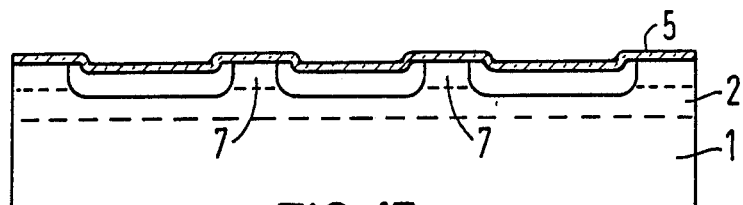

FIG. 16 shows a semiconductor chip according to FIG. 15, which is solidly coated with a silicon nitride layer as second layer 5.

Figure 17:
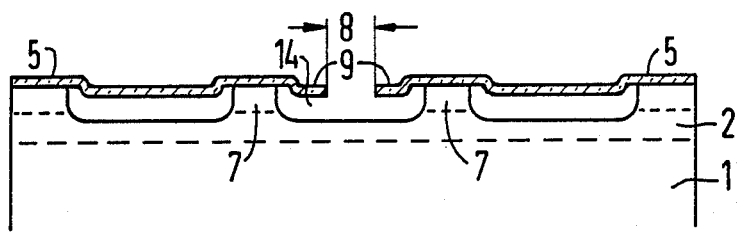

FIG. 17 shows a semiconductor chip according to FIG. 16 which is provided with a window 8 in the silicon nitride layer 5. Through window 8 the underlying portion 14 of the silicon dioxide layer is etched away selectively, as described with reference to FIG. 8. Thereafter the nitride brims 9 are etched away, as also described in detail with reference to FIG. 8.

Figure 18:
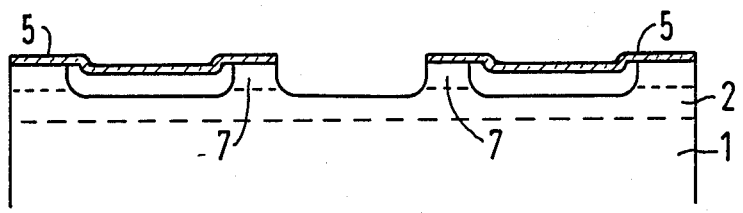

FIG. 18 shows a semiconductor plate according to FIG. 17 after completed etching away of the brim 9. Thereafter the remaining residual nitride layer 5 has about half its initial film thickness, for example.

Figure 19:
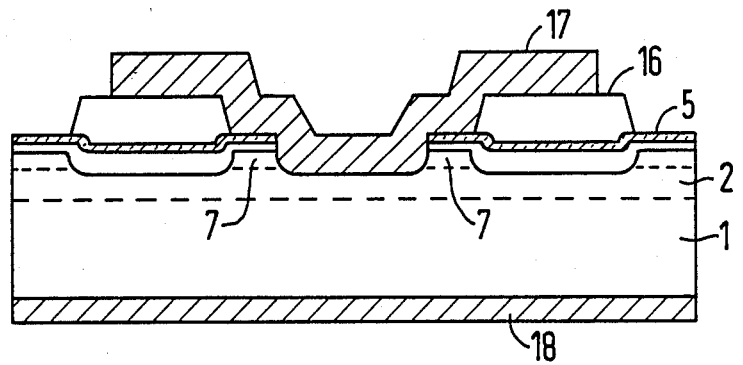

FIG. 19 shows a semiconductor chip according to FIG. 18 which may, similarly as described in FIG. 10, be provided with an additional insulator layer 16 and have a Schottky contact 17 and a substrate contact 18. A semiconductor chip according to FIG. 19 has essential advantages: The guard ring 7 is self-aligning, the depressions in the regions 28 and 29 are self-aligning, and the series resistance between the Schottky contact and the back of the semiconductor chip. Where in FIG. 19 the substrate contact is applied, becomes smaller due to the depression in region 28. With a Schottky diode according to FIG. 19, also guard ring widths smaller than 0.2 $\mu$m can be realized.

FIGS. 20 to 24 explain a method according to a third embodiment of the invention. This new process achieves by insertion of an oxide-nitride double layer and by an additional eroding technique that the outer edge of the guard ring is securely shielded. The position of the oxide-nitride passivation edge relative to the inner edge of guard ring 7 can be adjusted in a defined manner.

Figure 20:
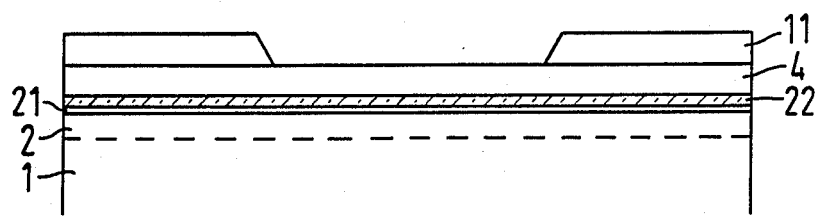
FIGS. 20 to 24 depict the results of a series of processing steps for the production of a Schottky contact according to a third illustrative embodiment of the invention.

FIG. 20 shows a semiconductor chip where first an oxide layer 23 and then a nitride layer 22 are applied on the semiconductor surface 3. The oxide-nitride double layer on the semiconductor surface 3 thus consists of the two layers 21, 22. On this oxide-nitride double layer an oxide layer 4 is applied in known manner, which is structured for example by means of photo technique or advantageously by reactive ion etching. In either process, photo resist layer 11 is patterned or structured to have openings defining the areas to be removed.

Figure 21:
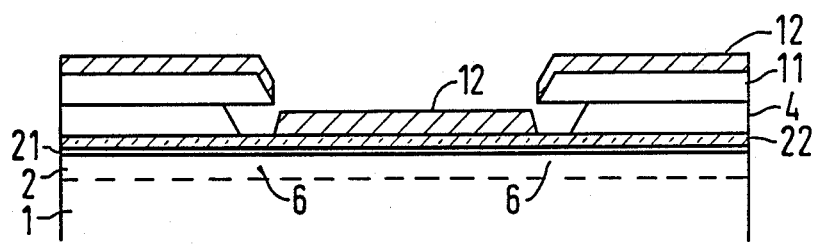

FIG. 21 shows a semiconductor chip according to FIG. 20, where parts of the oxide layer 4 exposed via photo resist mask 11 have been removed by oxide etching with understanding and which has then been coated with a metal 12.

Figure 22:
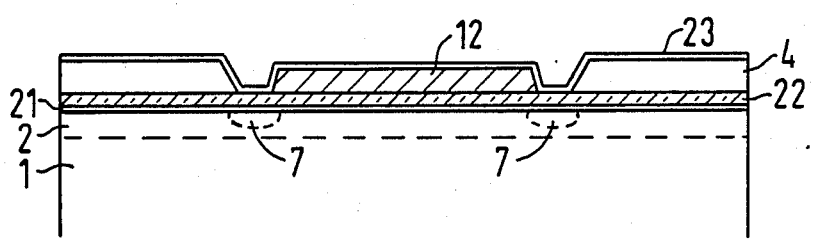

FIG. 22 shows a semiconductor chip according to FIG. 21, where the photo resist 11 has been removed, where the guard ring region 6 has been doped, and where an additional oxide layer 23 has been applied. The additional oxide layer 23 serves as etching allowance in subsequent etching processes with respect to the oxide nitride double layer.

Figure 23:
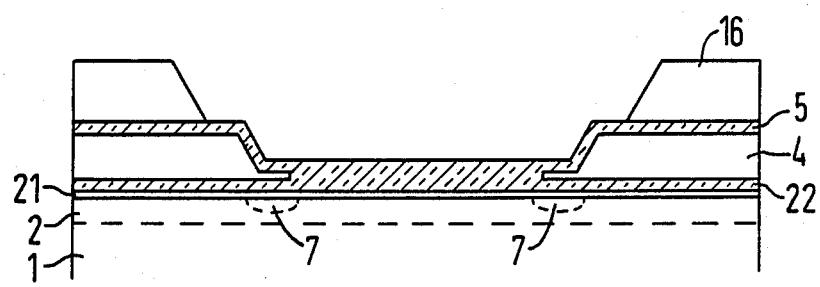

FIG. 23 shows a semiconductor chip according to FIG. 22, where the metal 12 has been removed, where a nitride layer 5 has been applied, which has been coated with an additional oxide layer 16, and where the additional oxide layer 16 has been structured for example by photo technique or by reactive ion etching. Removal of the metal 12 remaining inside the guard ring 7 can be achieved in that a window is opened for example in the oxide 23 covering the mask portion situated in the interior of the guard ring 7, and that the underlying metal is etched away with acid across the window.

Figure 24:
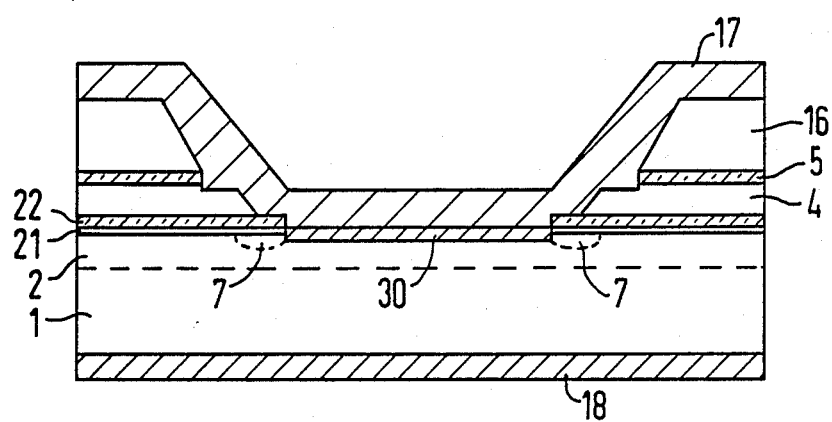

FIG. 24 shows a semiconductor chip according to FIG. 23, where first parts of the nitride layer 5 and parts of the nitride layer 22, insofar as they are not protected by the oxide layer 4, have been etched away with phosphoric acid, where the thin portions of the oxide layer 4 have been etched away by brief overetching with hydrofluoric acid, on which then a Schottky metal 17 has been applied, and where finally a silicide layer 30 has been formed.

The oxide layer 23 is used in FIG. 22 as diffusion oxide for the doping of the guard ring region 6 by implantation. Because of the now possible higher implantation energy it is achieved that the danger of guard ring weaknesses due to rough masking metallization is reduced. This makes it easier to realize effective guard ring widths smaller than 0.2 $\mu$m.

With a semiconductor chip according to FIG. 24, silicide formation is possible without danger of shortcircuits.

For a semiconductor chip which has been produced by a method illustrated in FIGS. 20 to 24 also moat etching is permitted.

The underetching time in the etching of the oxide layer 4 determines the distance of the oxide edge of oxide layer 4 from the inner edge of guard ring 7.

Radio frequency Schottky diodes have epitaxial film thicknesses of about 0.1 $\mu$m. Other Schottky diodes have epitaxial film thicknesses of about 2 $\mu$m. If on these epitaxial layers silicon etching is to be performed, the oxide-nitride double layer serves as etching allowance. The oxide-nitride double layer makes possible a defined width of the guard ring 7 also for silicide formation and also for most etching. With silicide formation and with moat etching the passivation edge of the oxide-nitride double layer determines the inner edge of guard ring 7.

Figure 25:
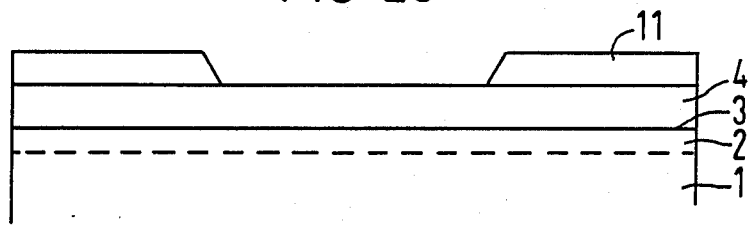
FIGS. 25 to 29 illustrate the product of processing steps for the production of a Schottky contact in accordance with a fourth illustrative embodiment of the invention.
Figure 26:
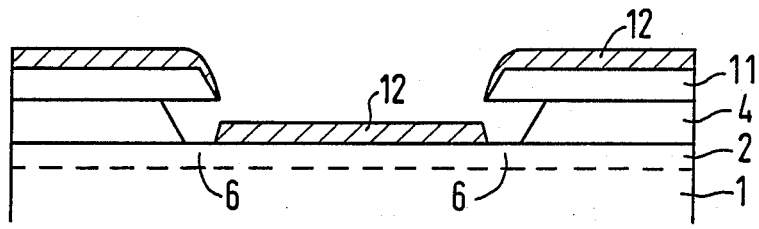

FIG. 25 is identical with FIG. 1. FIG. 26 is identical with FIG. 2. The process steps for the production of a semiconductor chip according to FIGS. 25 and 26 correspond to the process steps for the production of a semiconductor chip according to FIGS. 1 and 2.

Figure 27:
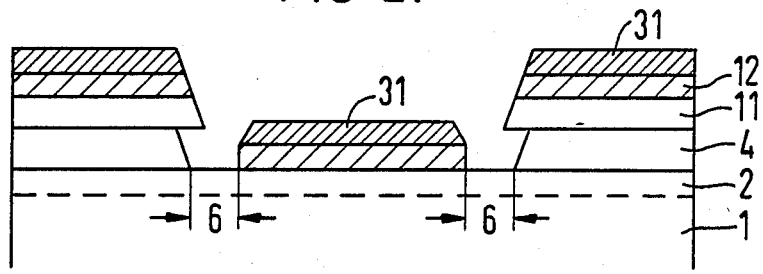

FIG. 27 shows a semiconductor chip according to FIG. 26 where on the metal layer 12 an additional metal layer 31 has been applied. The additional metal layer 31 can, for example, be vapor deposited with a point source, so that steep edges form at the metal piece which lies in the interior of the guard ring region 6. This metal piece in the interior of the guard ring region 6 serves as masking for the later doping of the guard ring by implantation.

Figure 28:
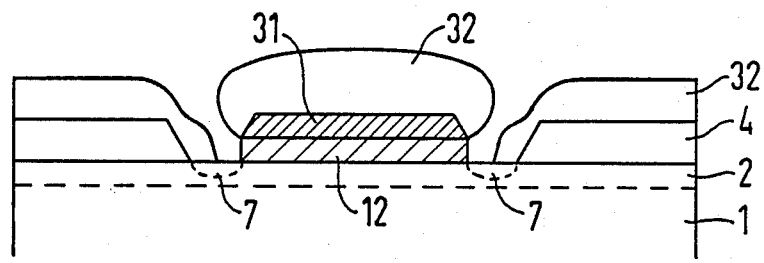

FIG. 28 shows a semiconductor chip according to FIGS. 27, where the photo resist layer 11 has been removed, where by doping of the guard ring region 6 the guard ring 7 has been produced, and which has been coated with an oxide layer 32. Before implantation, a thin diffusion oxide layer may be applied in the guard ring region 6, which is removed again after the implantation and before application of the oxide layer 32. The distance of the passivation edge of oxide layer 4 from the passivation edge of oxide layer 32 is self-aligning. The oxide layer 32 may be applied thick at least in part. The oxide layer 32 forms a self-aligning protective layer for guard ring 7. The oxide layer 32 forms a mask for the subsequent removal of the metal 12 remaining inside the guard ring 7. The passivation edge of oxide layer 32 may coincide with the inner edge of guard ring 7. Alternatively the passivation edge of oxide layer 32 may lie between the inner edge and the outer edge of guard ring 7 and have a defined, self-aligning distance from the inner edge of guard ring 7. This fact, namely that the distance of the passivation edge of oxide layer 32 from the inner edge of guard ring 7 can be adjusted in a defined manner, is important for moat etching. In such moat etching the oxide layer 32 is not attached.

The defined adjustment of the distance of the passivation edge of oxide edge layer 32 from the inner edge of guard ring 7 can occur, for example, by different application of the oxide layer 32, by different thickness of the oxide layer 32, or by different edge formation during vapor deposition of the additional metal 31.

Figure 29:
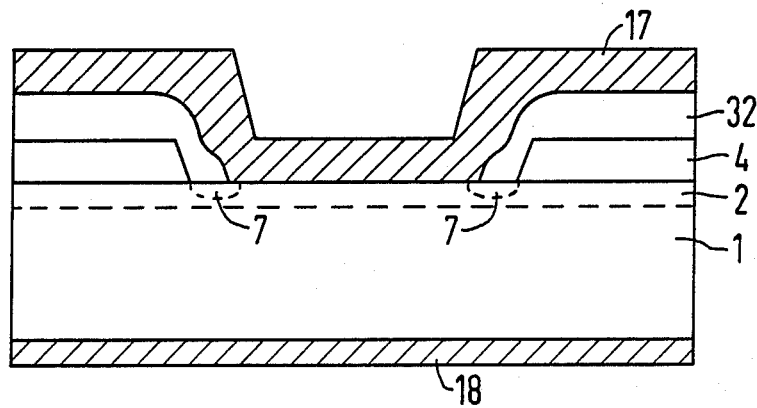

FIG. 29 shows a semiconductor chip according to FIG. 28, where the metal 12 left inside the guard ring 17 has been removed and where finally the Schottky metal 17 has been applied. For a semiconductor chip according to FIG. 29, both silicide formation and moat etching are permitted.

Removal of the metal 12 left inside guard ring 7 can be achieved in that a window is opened for example in the oxide 32 covering the mask portion situated in the interior of guard ring 7 and that the metal therebelow is etched away with acid across the window. If titanium is used in metal 12, palladium, which has been vapor deposited as additional metal 31 on titanium, makes it possible that the underlying titanium can easily be removed even at relatively thick oxide layer 32. If the oxide layer 32 is not so thick, the additional metal 31 can be dispensed with. To etch away the palladium aqua regia is suitable, while hot phosphoric acid is suitable for etching away the titanium lying under the palladium.

Figure 30:
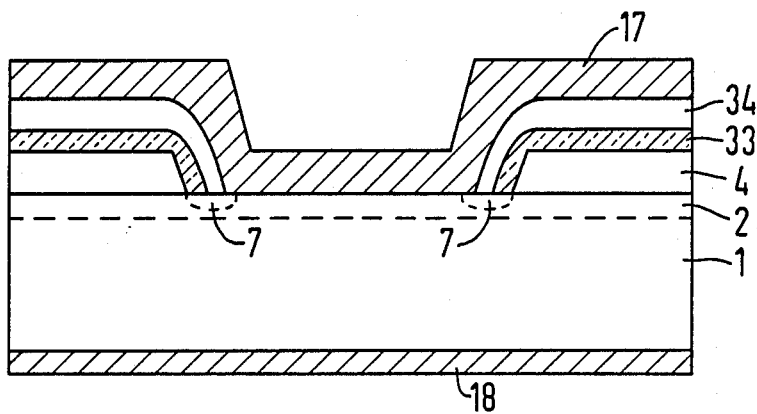
FIG. 30 illustrates the product of a method according to the invention resulting in a fifth illustrative embodiment.

FIG. 30 shows a fifth embodiment for a semiconductor chip according to the invention. A semiconductor chip according to FIG. 30 can be produced entirely like a semiconductor chip according to FIG. 29 if instead of the oxide layer 32 in FIG. 28 there are applied first a nitride layer 33 and then an oxide layer 34. The nitride layer 33 can for example be sputterred on or be applied as plasma nitride.

In a semiconductor chip according to FIG. 23 or according to FIG. 24, the position of the passivation edge of the oxide-nitride double layer is self-aligning with respect to the inner edge of guard ring 7.

In all embodiments the photo resist layer 11 can be replaced by another auxiliary layer suitable for the particular structuration technique chosen.

Application of the invention is advantageous for guard ring widths smaller than 2.5 μm, more particularly for guard ring widths in the range of tenths of a micron.

The individual layers of a Schottky diode may consist also of materials other than those mentioned by way of example. What matters is that, depending on the purpose of use, the layers insulate for example or are selectively etchable or have other properties that exist in the materials mentioned by way of example.

There has thus been shown and described and a plurality of novel illustrative embodiments of Schottky contacts for semiconductors which fulfills all the objects and advantages sought therefor. Many changes, modifications, variations and other uses and applications of the subject invention will, however, become apparent to those skilled in the art after considering the specification and the accompanying drawing which disclose preferred embodiment thereof. All such changes, modifications, variations and other uses and applications which do not depart from the spirit and scope of the invention are deemed to be covered by the invention which is limited only by the claims which follow.

What is claimed is:

1. A method for producing a Schottky contact on a semiconductor surface wherein the contact comprises a doped guard ring applied as self-aligning in a semiconductor edge region of the Schottky contact, and where portions of the semiconductor edge region are covered by at least two layers, a first layer and a second layer applied over the first layer, which layers comprise different, selectively etchable electrically insulating materials, the method is characterized by the following steps: depositing on at least portions of the semiconductor surface the first layer to provide a structured first layer; depositing the second layer on the first layer and on any exposed semiconductor surface; forming a window in the second layer in the region above the guard ring after the guard ring has been doped; etching through the window that section of the first layer lying directly below the window and then laterally to remove all of the structured first layer uncovered by the second layer; and applying the Schottky contact on the exposed semiconductor surface.

2. A method according to claim 1, wherein doping of the guard ring across the second layer is possible due to the thickness of the second layer.

3. The method of claim 1, wherein prior to the step of forming, the step of etching the exposed semiconductor surface occurs and after the guard ring has been doped, etching only the first layer away completely in the contact region via the window, and applying an addition insulation layer in a circular pattern having an inner dimension corresponding to the exterior portion of the self aligned guard ring prior to the step of applying the Schottky contact.

4. A method for processing a Schottky contact on a semiconductor surface which contact comprises a doped guard ring self aligning deposited in a semiconductor edge region of the Schottky contact and where portions of the semiconductor edge region are covered by at least two layers, the method comprising the steps of: 1. depositing a first layer on at least portions of the semiconductor surface, 2. applying on this first layer a first auxiliary layer for the structuring of the first layer, 3. etching the first layer for structuring, 4. applying a second auxiliary layer for the masking of the guard ring region, 5. removing the first auxiliary layer, 6. doping the guard ring region, 7. applying at least one additional layer for self-aligning, and 8. applying a Schottky contact.

5. A method according to claim 4, wherein an oxide-nitride double layer is applied to the semiconductor surface before the first layer and wherein the doping of the guard ring region is performed through the oxide-nitride double layer; wherein a further oxide layer is applied as etching allowance for the oxide-nitride double layer, the second auxiliary layer is removed, etching of the oxide-nitride double layer within the guard ring, and finally applying a Schottky metal.

6. A method according to claim 4, wherein after application of the additional oxide layer, the method further comprises the step of applying a nitride layer.

7. A method according to claim 4, further including on the nitride layer, applied is an additional oxide layer comprising a nitride layer.

8. A method according to claim 4, wherein using a photo resist serves as the first auxiliary layer.

9. A method according to claim 4, wherein said a metal serves as the second auxiliary layer.

10. A method according to claim 4, using an oxide layer serves as one of the additional layers applied as self-aligning.

11. A method according to claim 4, using a nitride layer serves as at least one of the additional layers applied as self-aligning.

12. A method according to claim 5, wherein the first auxiliary layer is provided by applying a photo resist.

13. A method according to claim 5, wherein the first auxiliary layer is provided by applying a photo resist.

14. A method according to claim 8, using an oxide layer serves as one of the additional layers applied as self-aligning.

15. A method according to claim 8, using a nitride layer serves as at least one of the additional layers applied as self-aligning.

16. A method according to claim 9, wherein vapor deposition an additional metal on the metal of the second auxiliary layer.

17. A method according to claim 9, using a nitride layer serves as at least one of the additional layers applied as self-aligning.

18. A method according to claim 9, using an oxide layer serves as one of the additional layers applied as self-aligning.

19. A method according to claim 10, using a nitride layer serves as at least one of the additional layers applied as self-aligning.

20. A method according to claim 16, wherein titanium is used as metal for the second auxiliary layer and that on this palladium is vapor deposited.

21. A method according to claim 16, using an oxide layer serves as one of the additional layers applied as self-aligning.

22. A method according to claim 16, using a nitride layer serves as at least one of the additional layers applied as self-aligning.

23. A method according to claim 20, using an oxide layer serves as one of the additional layers applied as self-aligning.

24. A method according to claim 20, using a nitride layer serves as at least one of the additional layers applied as self-aligning.

* * * * *